US010813243B2

(12) United States Patent
Shoujiguchi et al.

(10) Patent No.: US 10,813,243 B2
(45) Date of Patent: Oct. 20, 2020

(54) PHASE-CHANGE COOLING DEVICE AND PHASE-CHANGE COOLING METHOD

(71) Applicant: NEC Corporation, Tokyo (JP)

(72) Inventors: Akira Shoujiguchi, Tokyo (JP); Minoru Yoshikawa, Tokyo (JP); Masaki Chiba, Tokyo (JP); Arihiro Matsunaga, Tokyo (JP); Masanori Sato, Tokyo (JP)

(73) Assignee: NEC Corporation, Tokyo (JP)

( * ) Notice: Subject to any disclaimer, the term of this patent is extended or adjusted under 35 U.S.C. 154(b) by 640 days.

(21) Appl. No.: 15/506,564

(22) PCT Filed: Aug. 20, 2015

(86) PCT No.: PCT/JP2015/004159
§ 371 (c)(1),
(2) Date: Feb. 24, 2017

(87) PCT Pub. No.: WO2016/031195
PCT Pub. Date: Mar. 3, 2016

(65) Prior Publication Data
US 2017/0280585 A1     Sep. 28, 2017

(30) Foreign Application Priority Data

Aug. 27, 2014   (JP) .................................. 2014-172115

(51) Int. Cl.
*H05K 7/20* (2006.01)
(52) U.S. Cl.
CPC ..... *H05K 7/20127* (2013.01); *H05K 7/20309* (2013.01); *H05K 7/20318* (2013.01); *H05K 7/20827* (2013.01)

(58) Field of Classification Search
CPC ............ H05K 7/2029; H05K 7/20309; H05K 7/23018; H05K 7/20327; H05K 7/20318; F25B 2400/16; F25B 5/02
See application file for complete search history.

(56) References Cited

U.S. PATENT DOCUMENTS

| 3,638,447 | A | * | 2/1972 | Abe | ..................... F25B 5/00 |
| | | | | | 62/222 |
| 2002/0007641 | A1 | * | 1/2002 | Marsala | ............... F25B 23/006 |
| | | | | | 62/119 |

(Continued)

FOREIGN PATENT DOCUMENTS

| JP | 55-51275 | 4/1980 |
| JP | 61-169374 | 10/1986 |

(Continued)

OTHER PUBLICATIONS

International Search Report and Written Opinion dated Nov. 17, 2015, in corresponding PCT International Application.

*Primary Examiner* — David J Teitelbaum
(74) *Attorney, Agent, or Firm* — Finnegan, Henderson, Farabow, Garrett & Dunner, L.L.P.

(57) ABSTRACT

It is impossible to avoid the increase in device cost and maintenance cost in order to cool a plurality of heat sources efficiently using a natural-circulation type phase-change cooling device; therefore, a phase-change cooling device according to an exemplary aspect of the present invention includes a plurality of heat receiving units configured to hold respectively refrigerant receiving heat from a plurality of heat sources; a condensing unit configured to generate refrigerant liquid by condensing and liquefying refrigerant vapor of the refrigerant evaporated in the heat receiving units; a refrigerant vapor transport structure connecting the heat receiving units to the condensing unit and configured to transport the refrigerant vapor; and a refrigerant liquid (Continued)

transport structure connecting the heat receiving units to the condensing unit and configured to transport the refrigerant liquid, wherein the refrigerant liquid transport structure includes a main-liquid-pipe connected to the condensing unit, a refrigerant liquid reservoir connected to the main-liquid-pipe and configured to store the refrigerant liquid, and a plurality of sub-liquid-pipes respectively connecting the refrigerant liquid reservoir to the plurality of heat receiving units.

18 Claims, 13 Drawing Sheets

(56) References Cited

U.S. PATENT DOCUMENTS

| | | | |
|---|---|---|---|
| 2009/0158757 A1 | 6/2009 | Marsala | |
| 2012/0324933 A1* | 12/2012 | Louvar | H05K 7/20327 62/196.4 |
| 2014/0230478 A1* | 8/2014 | Agostini | H05K 7/20309 62/259.2 |
| 2016/0014933 A1* | 1/2016 | Matsunaga | G06F 1/20 361/679.53 |

FOREIGN PATENT DOCUMENTS

| | | |
|---|---|---|
| JP | 2000-121137 | 4/2000 |
| JP | 2001-208272 | 8/2001 |
| JP | 2009-194093 | 8/2009 |
| JP | 2009-200472 | 9/2009 |

\* cited by examiner

PHASE-CHANGE COOLING DEVICE AND PHASE-CHANGE COOLING METHOD

CROSS-REFERENCE TO RELATED PATENT APPLICATIONS

This application is a National Stage Entry of International Application No. PCT/JP2015/004159, filed Aug. 20, 2015, which claims priority from Japanese Patent Application No. 2014-172115, filed Aug. 27, 2014. The entire contents of the above-referenced applications are expressly incorporated herein by reference.

TECHNICAL FIELD

The present invention relates to phase-change cooling devices and phase-change cooling methods used for cooling electronic devices, and the like, in particular, to a phase-change cooling device and a phase-change cooling method employing natural circulation in which refrigerant vapor phase-changed by heat receiving is transported without a driving source and condensed.

BACKGROUND ART

In recent years, the required amount of information processing has increased with the improvement in information processing technologies and the rise of the Internet environment. Data centers (DCs) are installed and operated in various places in order to process huge volumes of data. Here, the data center (DC) means a specialized facility for installing and operating severs and data communication devices. In the data centers (DCs), the density of heat generation by electronic devices such as a server and a data communication device is extremely high; consequently, it is necessary to cool these electronic devices efficiently.

A natural-circulation type phase-change cooling system has been known as an example of efficient cooling systems for electronic devices and the like (see, Patent Literature 1, for example). In the natural-circulation type phase-change cooling system, the heat generated by a heat source such as an electronic device is received and radiated using the latent heat of refrigerant. This system makes it possible to drive the refrigerant circularly without power supply because of the buoyancy of refrigerant vapor and the gravity of refrigerant liquid. Accordingly, the natural-circulation type phase-change cooling system enables efficient and energy-saving cooling of electronic devices and the like.

An example of a natural-circulation type phase-change cooling device is described in Patent Literature 1. A related cooling system disclosed in Patent Literature 1 includes evaporators set respectively in a plurality of servers, a cooling tower installed on the roof of a building, a return pipe (refrigerant gas pipe), and a supply pipe (refrigerant liquid pipe). The return pipe and the supply pipe connect cooling coils set in the evaporators to a spiral pipe set in the cooling tower. The return pipe returns the refrigerant gas vaporized in the evaporators to the cooling tower. The supply pipe supplies the evaporators with the refrigerant liquid that is liquefied resulting from cooling and condensing the refrigerant gas in the cooling tower. This forms a circulation line through which the refrigerant circulates naturally, between the evaporators and the cooling tower.

Each evaporator is provided with a temperature sensor to measure the temperature of the air that results from cooling, in the evaporator, the high temperature air exhausted from a server. At the outlet of the cooling coil in each of the evaporators, a valve (flow adjustment means) is provided that adjusts the supply flow rate of the refrigerant supplied to the cooling coil (refrigerant flow). A controller automatically adjusts the degree of opening of each valve based on the temperature measured by the temperature sensor. This enables the supply flow rate of the refrigerant to decrease by narrowing the opening of the valve if the temperature of the air that has been cooled in the evaporators becomes too lower than a predetermined temperature.

It is said that, according to the related cooling system, the above-described configuration keeps the supply flow rate of the refrigerant in each evaporator from increasing more than necessary; accordingly, it is possible to reduce the cooling load of the refrigerant and achieve a sufficient cooling performance by using a cooling tower only.

CITATION LIST

Patent Literature

[PTL 1] Japanese Unexamined Patent Application Publication No. 2009-194093 (paragraphs [0047] to [0055], FIG. 1)

SUMMARY OF INVENTION

Technical Problem

As mentioned above, the related cooling system disclosed in Patent Literature 1 is configured to include valves respectively to adjust the supply flow rate of the refrigerant supplied to the cooling coils that are disposed in the evaporators, and to adjust automatically the degree of opening of each valve based on the temperature of the air that has been cooled in the evaporators. That is to say, a computerized valve is disposed at each outlet of the plurality of evaporators and made to operate simultaneously with the temperature sensor, by which an appropriate amount of refrigerant liquid is supplied to each evaporator depending on the load of the server rack. The reason is that it becomes difficult to perform the phase-change cooling efficiently because the phase change is inhibited due to the pressure of the refrigerant liquid if there is too much fluid volume of the refrigerant liquid in each evaporator, and because it is impossible to absorb the heat without the phase change arising if there is less fluid volume of the refrigerant liquid.

However, because the related cooling system is configured to include a valve in each of the plurality of evaporators, there has been the problem that the related cooling system requires the cost not only of devices including a valve control system but also of the maintenance for stable operation.

Thus, there has been the problem that it is impossible to avoid the increase in device cost and maintenance cost in order to cool a plurality of heat sources efficiently using a natural-circulation type phase-change cooling device.

The object of the present invention is to provide a phase-change cooling device and a phase-change cooling method that solve the above-mentioned problem that it is impossible to avoid the increase in device cost and maintenance cost in order to cool a plurality of heat sources efficiently using a natural-circulation type phase-change cooling device.

Solution to Problem

A phase-change cooling device according to an exemplary aspect of the present invention includes a plurality of heat receiving units configured to receive heat; a condensing unit configured to radiate heat; and a first refrigerant pathway and a second refrigerant pathway connecting the plurality of heat receiving units to the condensing unit, wherein the first refrigerant pathway includes a main-refrigerant-pipe connected to the condensing unit, a refrigerant reservoir connected to the main-refrigerant-pipe and configured to store refrigerant circulating, and a plurality of sub-refrigerant-pipes each of which having one end connected to a correspondent of the plurality of heat receiving units and another end connected to the refrigerant reservoir.

A phase-change cooling device according to an exemplary aspect of the present invention includes a plurality of heat receiving units configured to hold respectively refrigerant receiving heat from a plurality of heat sources; a condensing unit configured to generate refrigerant liquid by condensing and liquefying refrigerant vapor of the refrigerant evaporated in the heat receiving units; a refrigerant vapor transport structure connecting the heat receiving units to the condensing unit and configured to transport the refrigerant vapor; and a refrigerant liquid transport structure connecting the heat receiving units to the condensing unit and configured to transport the refrigerant liquid, wherein the refrigerant liquid transport structure includes a main-liquid-pipe connected to the condensing unit, a refrigerant liquid reservoir connected to the main-liquid-pipe and configured to store the refrigerant liquid, and a plurality of sub-liquid-pipes respectively connecting the refrigerant liquid reservoir to the plurality of heat receiving units.

A phase-change cooling method according to an exemplary aspect of the present invention includes evaporating refrigerant by receiving heat from a plurality of heat sources; generating refrigerant liquid by condensing and liquefying refrigerant vapor evaporated; pooling the refrigerant liquid, and then separating the refrigerant liquid into a plurality of fluxes; and circulating the refrigerant liquid separated so as to receive heat respectively from the plurality of heat sources.

Advantageous Effects of Invention

According to the phase-change cooling device and the phase-change cooling method of the present invention, it is possible to cool a plurality of heat sources efficiently employing a natural-circulation type phase-change cooling system without the increase in device cost and maintenance cost.

EXAMPLE EMBODIMENT

Example embodiments of the present invention will be described below with reference to drawings.

A First Example Embodiment

A phase-change cooling device in accordance with a first example embodiment of the present invention includes a plurality of heat receiving units for receiving heat, a condensing unit for radiating heat, a first refrigerant pathway, and a second refrigerant pathway connecting the plurality of heat receiving units to the condensing unit. The first refrigerant pathway includes a main-refrigerant-pipe connected to the condensing unit, a refrigerant reservoir connected to the main-refrigerant-pipe and configured to store refrigerant circulating, and a plurality of sub-refrigerant-pipes each of which having one end connected to a correspondent of the plurality of heat receiving units and another end connected to the refrigerant reservoir.

Figure 1:
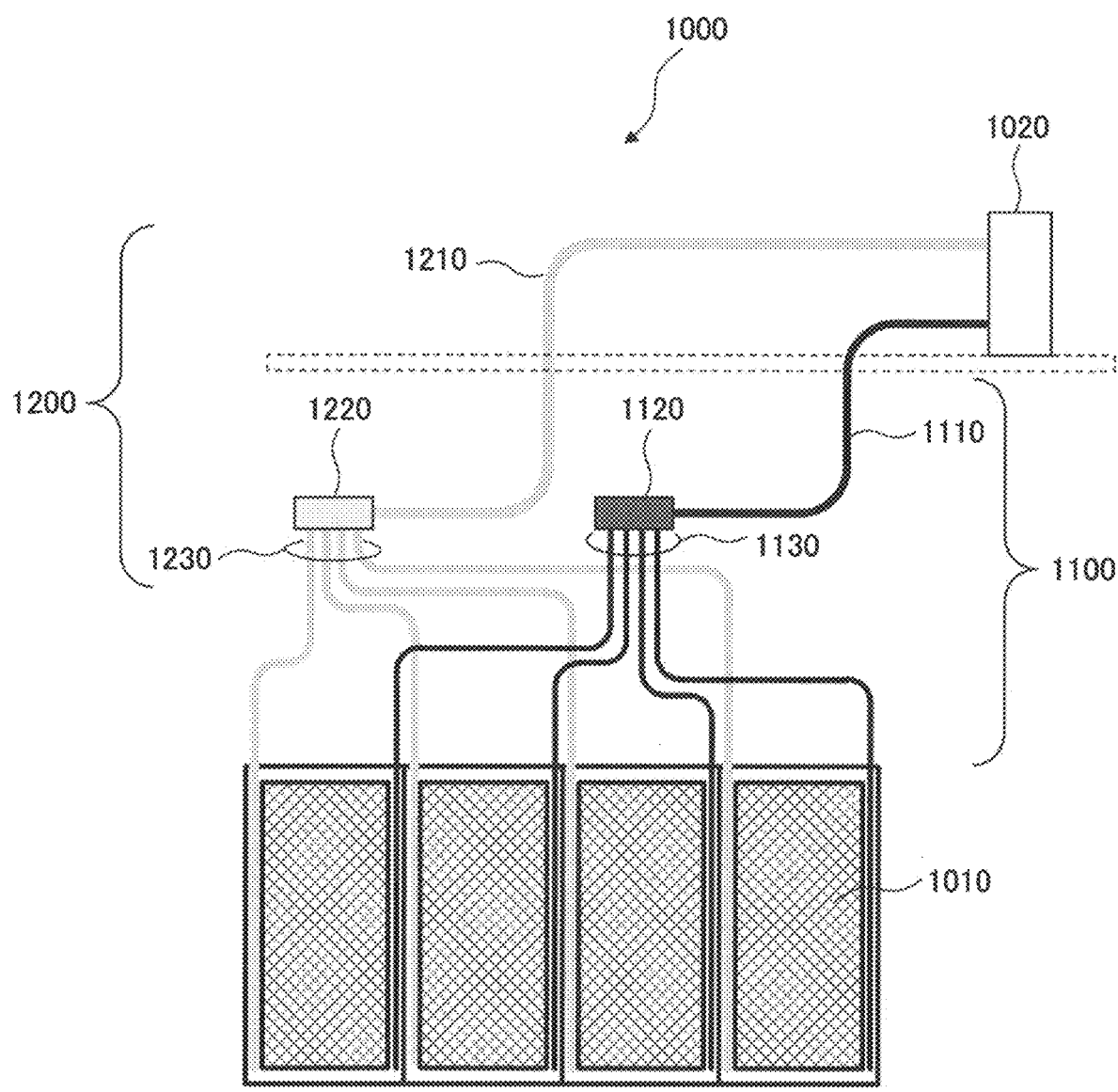
FIG. 1 is a schematic view illustrating a configuration of a phase-change cooling device in accordance with a first example embodiment of the present invention.

The phase-change cooling device in accordance with the first example embodiment of the present invention will be described further in detail. FIG. 1 is a schematic view illustrating the configuration of the phase-change cooling device 1000 in accordance with the first example embodiment of the present invention. The phase-change cooling device 1000 according to the present example embodiment includes a plurality of heat receiving units (evaporators) 1010, a condensing unit (condenser) 1020, a refrigerant liquid transport structure (a first refrigerant pathway) 1100, and a refrigerant vapor transport structure (a second refrigerant pathway) 1200.

The plurality of heat receiving units 1010 respectively hold refrigerant that receives heat from a plurality of heat sources. The condensing unit 1020 generates refrigerant liquid by condensing and liquefying refrigerant vapor of the refrigerant evaporated in the heat receiving units 1010. The refrigerant liquid transport structure 1100 connects the heat receiving units 1010 to the condensing unit 1020 and transports the refrigerant liquid. The refrigerant vapor transport structure 1200 connects the heat receiving units 1010 to the condensing unit 1020 and transports the refrigerant vapor.

The refrigerant liquid transport structure 1100 includes a main-liquid-pipe (main-refrigerant-pipe) 1110 connected to the condensing unit 1020, a refrigerant liquid reservoir (refrigerant reservoir) 1120 connected to the main-liquid-pipe 1110 and configured to store refrigerant liquid, and a plurality of sub-liquid-pipes (sub-refrigerant-pipes) 1130. The plurality of sub-liquid-pipes (sub-refrigerant-pipes) 1130 respectively connect the refrigerant liquid reservoir 1120 to the plurality of heat receiving units 1010.

As mentioned above, the phase-change cooling device 1000 according to the present example embodiment includes the refrigerant liquid reservoir 1120 in the refrigerant liquid transport structure 1100, and the refrigerant liquid reservoir is connected to the plurality of heat receiving units 1010 respectively by the plurality of sub-liquid-pipes 1130. The refrigerant liquid pools in the refrigerant liquid reservoir 1120 in operating condition; consequently, the refrigerant liquid reservoir 1120 is filled with the refrigerant as much as necessary to maintain the liquid level of the refrigerant liquid reservoir 1120. This makes the refrigerant liquid supplied in just proportion from the refrigerant liquid reservoir 1120 to each of the heat receiving units 1010, depending on the volume of the refrigerant liquid that decreases due to vaporization by receiving heat in each of the heat receiving units 1010. That is to say, it becomes possible to supply each of the heat receiving units 1010 with the refrigerant liquid whose volume corresponds to the load of each heat receiving unit 1010 without using driving parts, sensing elements, and the like.

Thus, according to the phase-change cooling device 1000 of the present example embodiment, it is possible to cool a plurality of heat sources efficiently employing a natural-circulation type phase-change cooling system without the increase in device cost and maintenance cost.

Although the configuration of the refrigerant vapor transport structure 1200 is not particularly limited, as illustrated in FIG. 1, for example, it can be configured to include a main-vapor-pipe 1210, a vapor joining portion 1220, and a plurality of sub-vapor-pipes 1230. The main-vapor-pipe 1210 is connected to the condensing unit 1020. The vapor joining portion 1220 is connected to the main-vapor-pipe 1210, and the refrigerant vapor meets in the vapor joining portion 1220. The plurality of sub-vapor-pipes 1230 connect the vapor joining portion 1220 to the plurality of heat receiving units 1010, respectively.

As illustrated in FIG. 1, the refrigerant liquid reservoir 1120 can be located in the vertically lower portion of the condensing unit 1020 and in the vertically upper portion of the plurality of heat receiving units 1010. This makes it possible to distribute the refrigerant liquid from the refrigerant liquid reservoir 1120 only by the action of gravity.

The heat receiving units 1010 can be configured to include a plurality of evaporating units each of which is thermally connected to a heat source and stores the refrigerant, and it can be configured in which the plurality of evaporating units are disposed in the vertical direction. Specifically, for example, the heat receiving unit 1010 can be a heat receiving module in which a plurality of servers as heat sources are disposed in a stack within a server rack, which includes the evaporating unit on a rear door or the like of the server rack. The refrigerant liquid reservoir 1120 can be located above the server rack, outside the rear door on which the heat receiving unit 1010 is disposed. The vapor joining portion 1220 can also be located above the server rack, outside the rear door on which the heat receiving unit 1010 is disposed.

Next, the operation of the phase-change cooling device 1000 according to the present example embodiment will be described.

The phase-change cooling device 1000 absorbs the heat that is generated in a plurality of servers disposed in the server rack, for example, by means of the heat receiving units 1010 included in respective server racks, and radiates the heat by the condensing unit 1020. This makes it possible to cool the servers and the like installed in the server rack.

Each of the heat receiving units 1010, which is provided in each server rack and absorbs the heat from the server rack, is connected to the sub-liquid-pipe 1130 and the sub-vapor-pipe 1230. The sub-liquid-pipe 1130 is connected to the main-liquid-pipe 1110 at the refrigerant liquid reservoir 1120, and the sub-vapor-pipe 1230 is connected to the main-vapor-pipe 1210 at the vapor joining portion 1220. The main-liquid-pipe 1110 and the main-vapor-pipe 1210 are connected to the single condensing unit 1020

The heat receiving unit 1010 is filled with the refrigerant liquid. The refrigerant liquid receives the exhaust heat from the server rack, and absorbs the heat, and vaporizes, by which the refrigerant liquid turns to the refrigerant vapor and rises by buoyancy. The refrigerant vapor flows toward the condensing unit 1020 through the sub-vapor-pipes 1230 with less pressure loss than the sub-liquid-pipe 1130. At this time, the refrigerant vapor streams from the respective heat receiving units 1010 meet in the vapor joining portion 1220 and then reach the condensing unit 1020 through the main-vapor-pipe 1210.

The refrigerant vapor radiates the heat in the condensing unit 1020 by exchanging the heat for air or water. The refrigerant condensed and liquefied in the condensing unit 1020 turns to refrigerant liquid, which flows toward the refrigerant liquid reservoir 1120 through the main-liquid-pipe 1110. The refrigerant liquid is distributed from the refrigerant liquid reservoir 1120 to the respective heat receiving units 1010, and the needed volume of the refrigerant liquid is supplied for each heat receiving unit 1010 through the sub-liquid-pipes 1130. This cooling cycle is continuously performed, which makes it possible to absorb the heat continuously from the server rack.

There can be not only refrigerant liquid but also refrigerant vapor in the main-liquid-pipe 1110, the refrigerant liquid reservoir 1120, and the sub-liquid-pipes 1130, which compose the refrigerant liquid transport structure 1100. Similarly, there can be not only refrigerant vapor but also refrigerant liquid in the main-vapor-pipe 1210, the vapor joining portion 1220, and the sub-vapor-pipes 1230, which compose the refrigerant vapor transport structure 1200.

Next, a phase-change cooling method according to the present example embodiment will be described.

In a phase-change cooling method according to the present example embodiment, first, refrigerant is evaporated by receiving heat from a plurality of heat sources, and refrigerant liquid is generated by condensing and liquefying the evaporated refrigerant vapor. The refrigerant liquid is pooled and then separated into a plurality of fluxes, and the separated refrigerant liquid is circulated so as to receive heat respectively from the plurality of heat sources. This makes it possible to cool a plurality of heat sources efficiently employing a natural-circulation type phase-change cooling system without the increase in device cost and maintenance cost.

A Second Example Embodiment

Next, a second example embodiment of the present invention will be described. In the present example embodiment, the refrigerant liquid transport structure 1100 included in the phase-change cooling device 1000 will be described further in detail.

Figure 2:
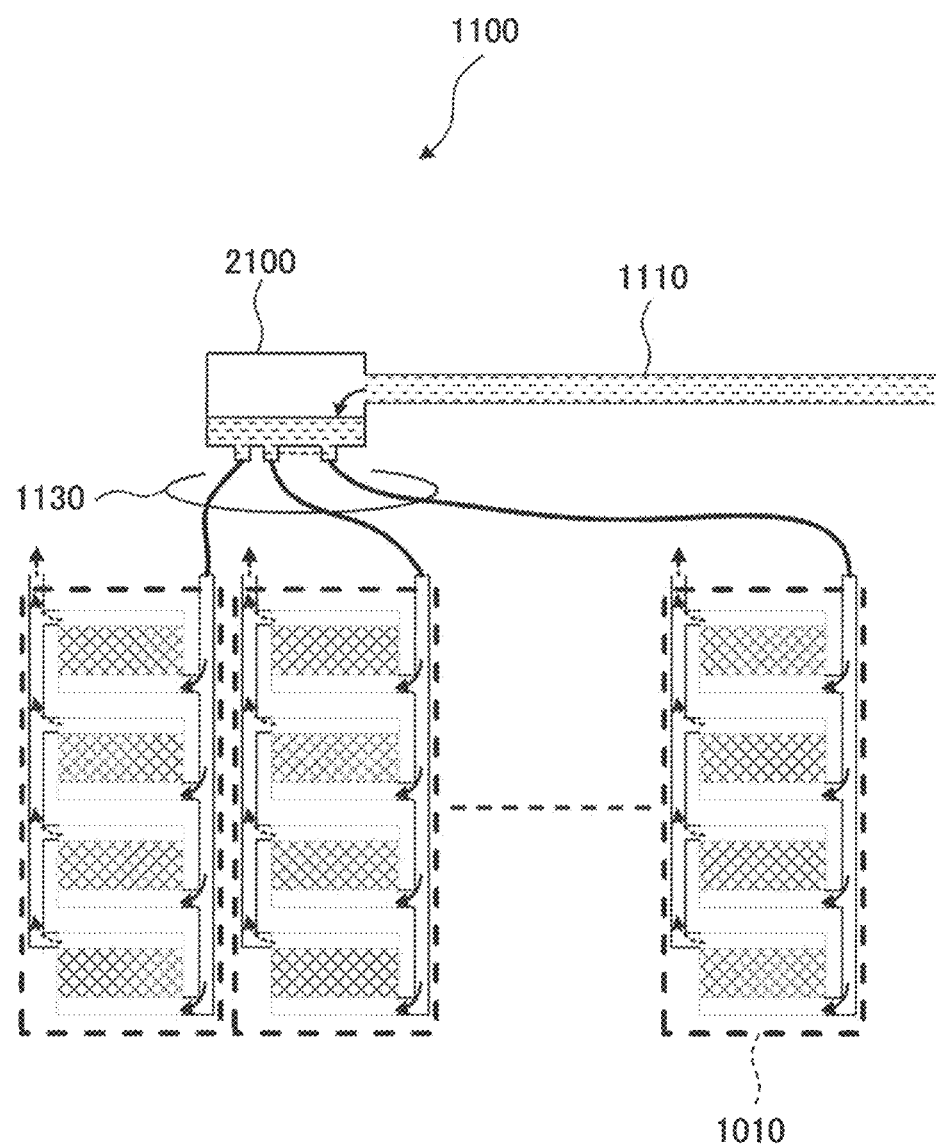
FIG. 2 is a cross-sectional view illustrating a configuration of a refrigerant liquid transport structure in accordance with a second example embodiment of the present invention.

FIG. 2 illustrates the configuration of the refrigerant liquid transport structure 1100 according to the present example embodiment. The refrigerant liquid transport structure 1100 according to the present example embodiment includes a main-liquid-pipe 1110 connected to a condensing unit, a refrigerant liquid reservoir 2100 connected to the main-liquid-pipe 1110 and configured to pool refrigerant liquid, and a plurality of sub-liquid-pipes 1130 respectively connecting the refrigerant liquid reservoir 2100 to a plurality of heat receiving units 1010.

Figure 3:
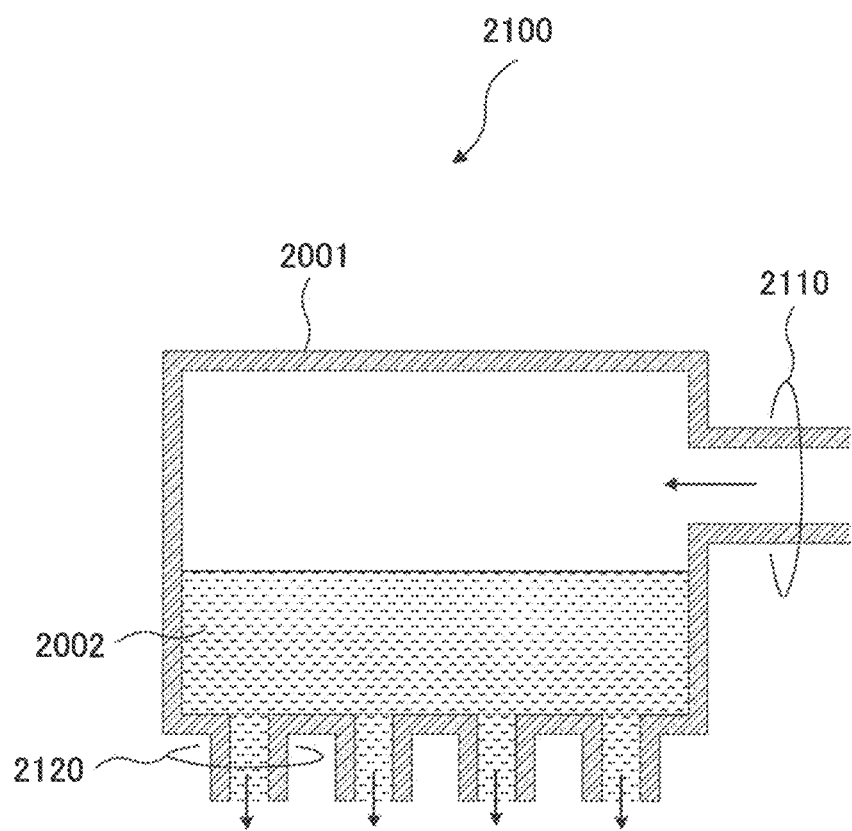
FIG. 3 is a cross-sectional view illustrating a configuration of a refrigerant liquid reservoir included in the refrigerant liquid transport structure in accordance with the second example embodiment of the present invention.

FIG. 3 illustrates the configuration of the refrigerant liquid reservoir 2100 according to the present example embodiment. The refrigerant liquid reservoir 2100 has a tank configuration and includes a container 2001. The container 2001 includes a main-liquid-pipe connection 2110 that is connected to the main-liquid-pipe 1110 that is located on one of the upper surface and the side surface, and a plurality of sub-liquid-pipe connections 2120 that are located on the bottom surface of the vertically lower side and that are connected to the sub-liquid-pipes 1130.

The volume of the refrigerant with which the whole of the phase-change cooling device 1000 is filled is set so that the refrigerant liquid 2002 flowing into the container 2001 from the main-liquid-pipe connection 2110 may maintain a certain liquid level in operating condition, as illustrated in FIG. 3. At this time, the refrigerant liquid, with the volume corresponding to that of the refrigerant liquid evaporated by receiving heat in each of the heat receiving units 1010, is supplied in just proportion from the sub-liquid-pipe connection 2120 to the heat receiving unit 1010. The refrigerant liquid having flowed out from the container 2001 to each of the heat receiving units 1010 evaporates again by receiving heat in each of the heat receiving units 1010, and then condensed and liquefied in the condensing unit 1020, and flows back to the refrigerant liquid reservoir 2100. This keeps constant the average volume of the refrigerant liquid within the phase-change cooling device 1000.

Figure 4A:
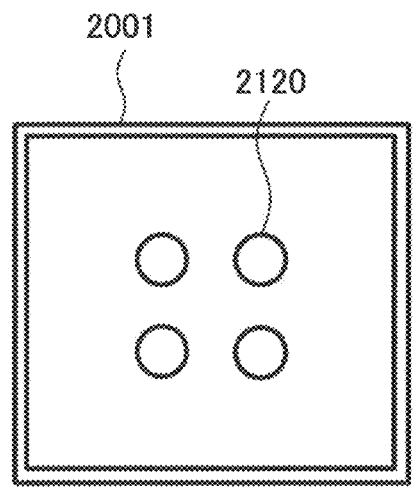
FIG. 4A is a bottom view illustrating a configuration of the refrigerant liquid reservoir included in the refrigerant liquid transport structure in accordance with the second example embodiment of the present invention.
Figure 4B:
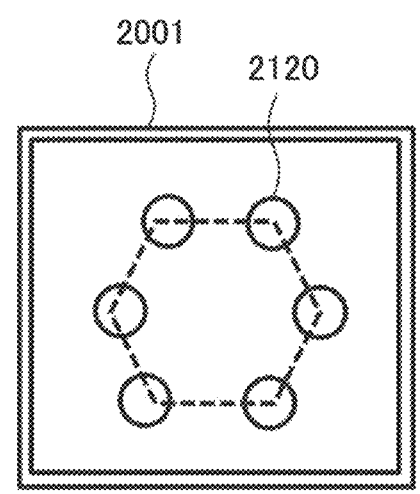
FIG. 4B is a bottom view illustrating another configuration of the refrigerant liquid reservoir included in the refrigerant liquid transport structure in accordance with the second example embodiment of the present invention.
Figure 4C:
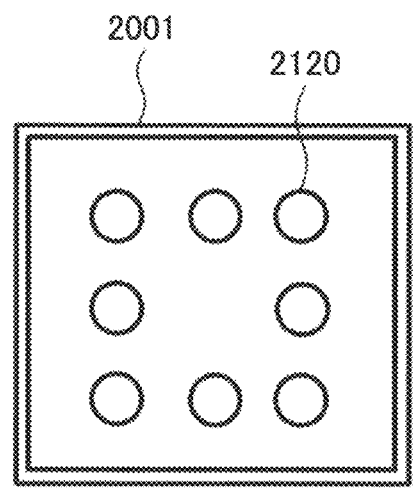
FIG. 4C is a bottom view illustrating yet another configuration of the refrigerant liquid reservoir included in the refrigerant liquid transport structure in accordance with the second example embodiment of the present invention.
Figure 4D:
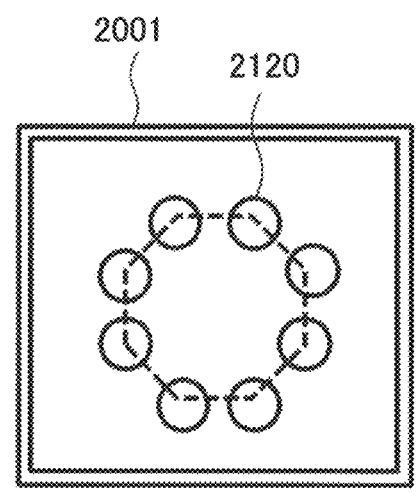
FIG. 4D is a bottom view illustrating still another configuration of the refrigerant liquid reservoir included in the refrigerant liquid transport structure in accordance with the second example embodiment of the present invention.

FIG. 4A to FIG. 4D illustrate examples of the configuration of the plurality of sub-liquid-pipe connections 2120. FIG. 4A to FIG. 4D are bottom views of the refrigerant liquid reservoir 2100. FIG. 4A illustrates the placement including four sub-liquid-pipe connections 2120, FIG. 4B illustrates it including six, and each of FIGS. 4C and 4D illustrates it including eight sub-liquid-pipe connections 2120, respectively. The refrigerant liquid reservoir 2100 is connected to the heat receiving units whose number corresponds to that of the sub-liquid-pipe connections 2120 through the sub-liquid-pipes, respectively. Since the heat receiving units are housed in server racks or the like, even numbers of the heat receiving units are often disposed, taking the placement of the rack into consideration. Accordingly, the examples with even numbers of sub-liquid-pipe connections 2120 are illustrated.

The sub-liquid-pipe connection 2120 can be configured to have a joint, and the joint is connected to a pipe composing the sub-liquid-pipe. It is preferable to dispose the sub-liquid-pipe connections 2120 equally spaced in multangular shape as illustrated in FIG. 4A to FIG. 4D, taking the placement and accommodation of a plurality of pipes into consideration.

Figure 5:
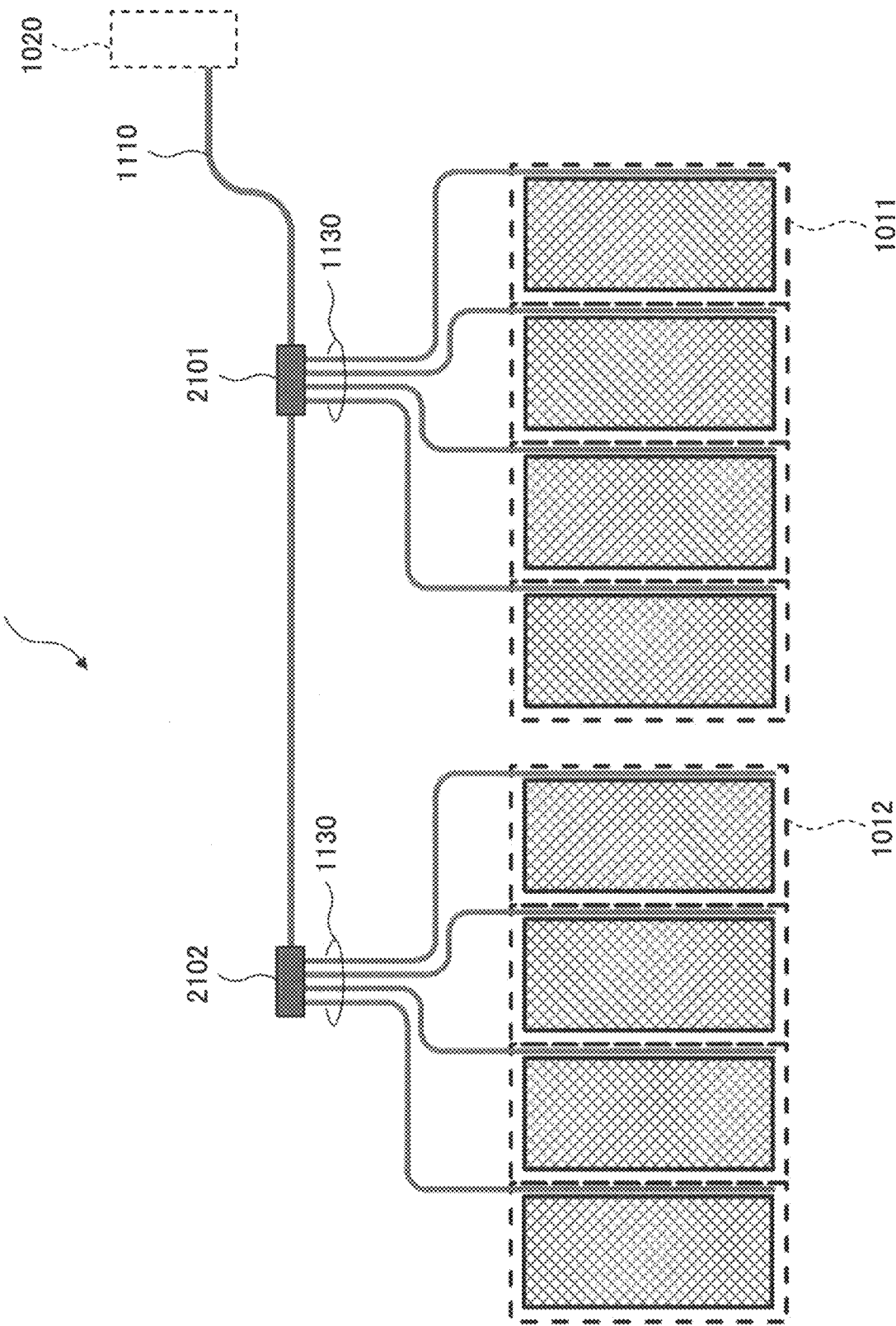
FIG. 5 is a cross-sectional view illustrating another configuration of the refrigerant liquid transport structure in accordance with the second example embodiment of the present invention.

FIG. 2 illustrates the configuration in which the refrigerant liquid transport structure 1100 includes a single refrigerant liquid reservoir 2100. However, the configuration is not limited to this, and, as illustrated in FIG. 5, it may be configured to include a plurality of refrigerant liquid reservoirs 2101, 2102, to which a plurality of different heat receiving units 1011, 1012 are respectively connected. The refrigerant liquid reservoirs 2101, 2102 are disposed with a slope heading for the vertically lower side from the condensing unit 1020 toward the refrigerant liquid reservoir 2101 and the refrigerant liquid reservoir 2102. This makes it possible to circulate the refrigerant liquid only by the action of gravity.

As mentioned above, according to the phase-change cooling device including the refrigerant liquid transport structures 1100, 1101 of the present example embodiment, it is possible to cool a plurality of heat sources efficiently employing a natural-circulation type phase-change cooling system without the increase in device cost and maintenance cost.

A Third Example Embodiment

Next, a third example embodiment of the present invention will be described. In the present example embodiment, a refrigerant liquid reservoir composing the refrigerant liquid transport structure 1100 included in the phase-change cooling device 1000 will be described further in detail.

Figure 6:
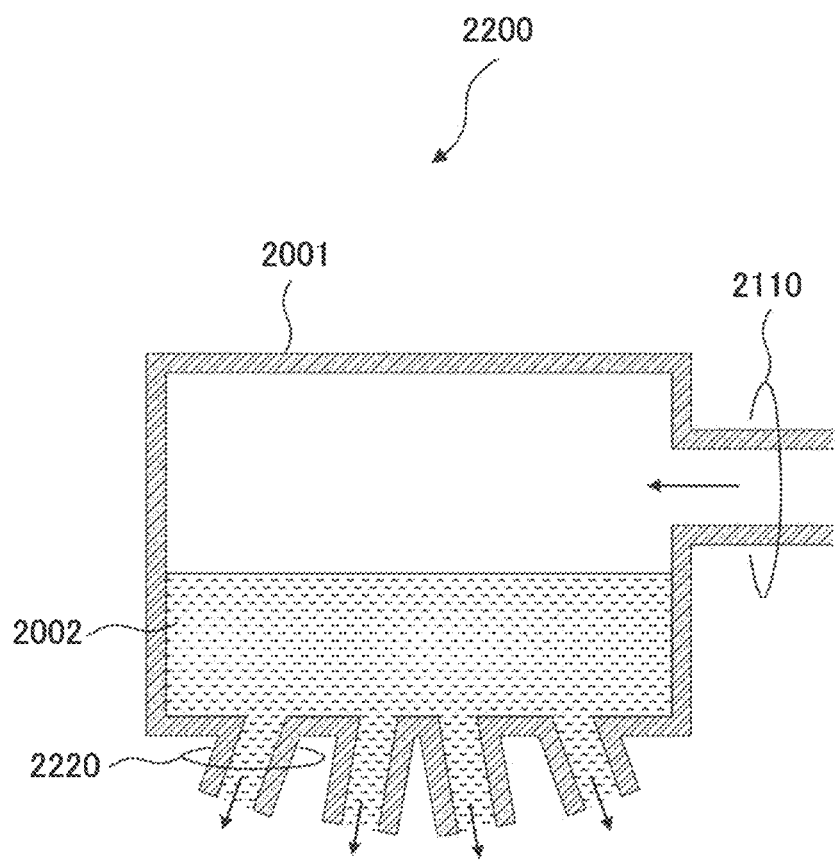
FIG. 6 is a cross-sectional view illustrating a configuration of a refrigerant liquid reservoir included in the refrigerant liquid transport structure in accordance with a third example embodiment of the present invention.

FIG. 6 is a cross-sectional view illustrating the configuration of a refrigerant liquid reservoir 2200 according to the present example embodiment. The refrigerant liquid reservoir 2200 according to the present example embodiment includes a container 2001; and the container 2001 includes a main-liquid-pipe connection 2110 that is located on one of the upper surface and the side surface and is connected to the main-liquid-pipe, and a plurality of sub-liquid-pipe connections 2220 that are located on the bottom surface of the vertically lower side and are connected to sub-liquid-pipes.

The plurality of sub-liquid-pipe connections 2220 are disposed near a position where the height of the bottom surface in the vertical direction is smallest. Typically, the plurality of sub-liquid-pipe connections 2220 can be disposed near the center of the bottom surface, for example.

Depending on installed conditions of the refrigerant liquid reservoir 2200, the container 2001 may have a bottom surface inclined from the horizontal plane or a bottom surface with a distortion in shape. However, even such a case, the above-mentioned configuration of the sub-liquid-pipe connections 2220 can prevent the refrigerant liquid 2002 from being distributed disproportionately to the specific sub-liquid-pipe connection 2220.

FIG. 6 illustrates the box-shaped container 2001 as an example. However, the shape of the container 2001 is not limited to this; the container 2001 may have a shape with a convex projecting vertically downward on a part of the bottom surface, and the plurality of sub-liquid-pipe connections 2220 may be disposed near the top of the convex where the height of the bottom surface in the vertical direction is smallest.

A Fourth Example Embodiment

Next, a fourth example embodiment of the present invention will be described. In the present example embodiment, a refrigerant liquid reservoir composing the refrigerant liquid transport structure 1100 included in the phase-change cooling device 1000 will be described further in detail.

Figure 7:
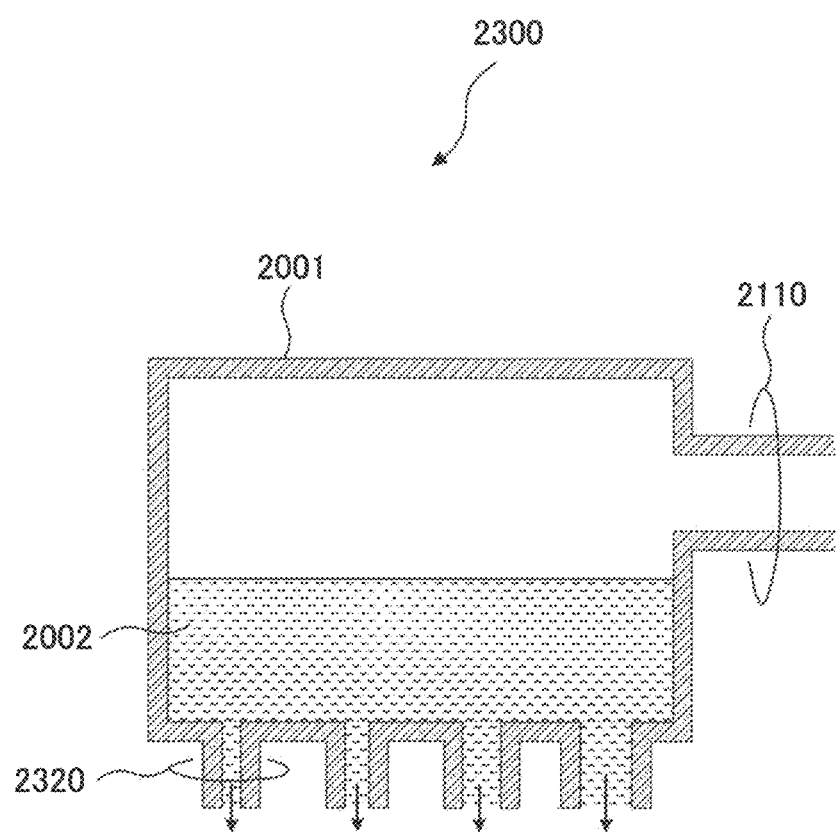
FIG. 7 is a cross-sectional view illustrating a configuration of a refrigerant liquid reservoir included in the refrigerant liquid transport structure in accordance with a fourth example embodiment of the present invention.

FIG. 7 is a cross-sectional view illustrating the configuration of the refrigerant liquid reservoir 2300 according to the present example embodiment. The refrigerant liquid reservoir 2300 according to the present example embodiment includes a container 2001; and the container 2001 includes a main-liquid-pipe connection 2110 that is located on one of the upper surface and the side surface and is connected to the main-liquid-pipe, and a plurality of sub-liquid-pipe connections 2320 that are located on the bottom surface of the vertically lower side and are connected to sub-liquid-pipes.

The plurality of sub-liquid-pipe connections 2320 according to the present example embodiment have joints. The container 2001 is configured to include at least two sub-liquid-pipe connections 2320 including the joints with their internal diameters differing from each other. That is to say, the refrigerant liquid reservoir 2300 according to the present example embodiment is configured to include a plurality of joints with the internal diameters differing from each other.

The configuration makes it possible to control the flow rate of the refrigerant liquid supplied to each heat receiving unit depending on the amount of heat generation in each heat receiving unit. That is to say, the heat receiving unit that receives a large amount of heat and consumes a large amount of refrigerant liquid is connected to the sub-liquid-pipe connection 2320 with the joint having a large internal diameter, which makes it possible to obtain larger flow rate of the refrigerant liquid. In contrast, the heat receiving unit that receives a small amount of heat is connected to the sub-liquid-pipe connection 2320 with the joint having a small internal diameter, which makes it possible to prevent excessive flow rate of the refrigerant liquid from being supplied.

The refrigerant liquid reservoir 2300 can be configured in which the sum of cross-sectional areas of the plurality of sub-liquid-pipe connections 2320 through which the refrigerant liquid flows is equal to the cross-sectional area of the main-liquid-pipe connection 2110 through which the refrigerant liquid flows. That is to say, the cross-sectional area $S_i$ of each sub-liquid-pipe connection 2320 through which the refrigerant liquid flows can be defined by the following equation:

$$S_i = SA \times Q_i / \Sigma Q_i \ (i=1 \text{ to } N)$$

wherein SA represents a cross-sectional area of the main-liquid-pipe connection 2110 through which the refrigerant liquid flows, $Q_i$ represents the amount of heat generation in each heat receiving unit 1010 to which each sub-liquid-pipe connection 2320 is connected, N represents the number of heat receiving units 1010, and $\Sigma Q_i$ represents a sum of the amounts of heat generation in N pieces of the heat receiving units 1010.

The reason is that the flow rate of the refrigerant liquid flowing out from the refrigerant liquid reservoir 2300 is proportional to the cross-sectional area of each sub-liquid-pipe connection 2320, the cross-sectional area of the joint, for example, and that the flow rate of the refrigerant liquid needed for each heat receiving unit 1010 is determined by the amount of heat generation in each heat receiving unit 1010. That is to say, the supply flow rate of the refrigerant liquid needed per unit time is determined depending on the amount of heat generation in each heat receiving unit 1010, and the upper limit of flow path resistance is determined that must be satisfied in order to supply the flow rate. It is possible to achieve efficient cooling in each heat receiving unit 1010 by selecting the diameter of the joint through which flow path resistance falls below the upper limit of the flow path resistance.

As mentioned above, depending on the amount of heat generation in the heat receiving unit 1010, the diameter of the joint composing the sub-liquid-pipe connection 2320 connected to the heat receiving unit is changed, which makes it possible to deliver a steady of the refrigerant liquid also to the heat receiving unit 1010 with a large amount of heat generation. The amount of heat generation in each heat receiving unit 1010 generally varies depending on the operational status of electronic devices as heat sources such as servers. However, it is often the case that the average amount of heat generation in each electric device is determined, in which case the diameter of the joint composing the sub-liquid-pipe connection 2320 can be determined using the average amount of heat generation.

Next, a specific example of the configuration of the sub-liquid-pipe connection 2320 will be described.

Figure 8A:
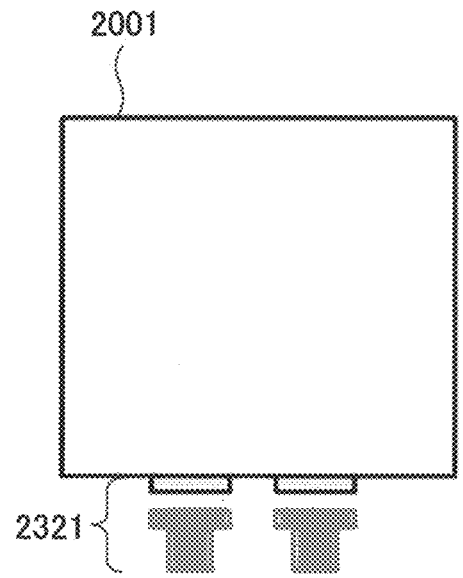
FIG. 8A is a schematic diagram illustrating a configuration of a sub-liquid-pipe connection included in the refrigerant liquid reservoir in accordance with the fourth example embodiment of the present invention.
Figure 8B:
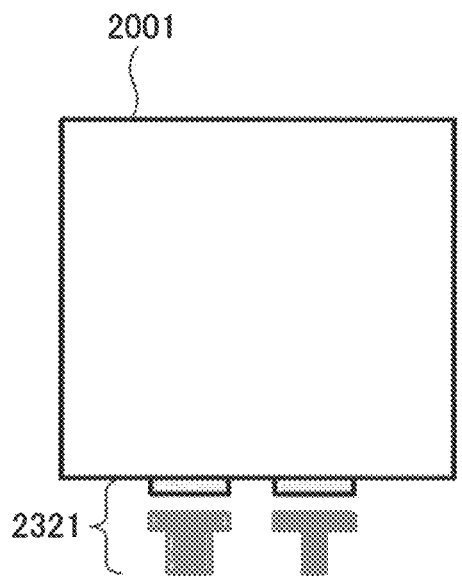
FIG. 8B is a schematic diagram illustrating a configuration of a sub-liquid-pipe connection included in the refrigerant liquid reservoir in accordance with the fourth example embodiment of the present invention.

FIG. 8A and FIG. 8B schematically illustrate examples in which the joint included in the sub-liquid-pipe connection 2321 is configured by flange connection. The diameter of the joint can be changed by replacing a type of the joint with a common flange part, as illustrated in FIG. 8B.

Figure 9A:
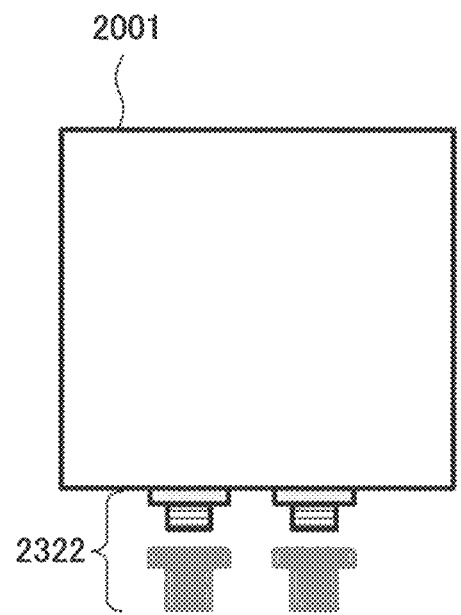
FIG. 9A is a schematic diagram illustrating a another configuration of a sub-liquid-pipe connection included in the refrigerant liquid reservoir in accordance with the fourth example embodiment of the present invention.
Figure 9B:
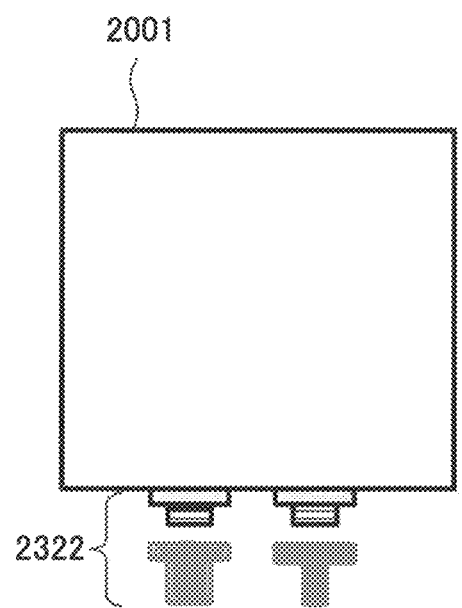
FIG. 9B is a schematic diagram illustrating a another configuration of a sub-liquid-pipe connection included in the refrigerant liquid reservoir in accordance with the fourth example embodiment of the present invention.

FIG. 9A and FIG. 9B schematically illustrate examples in which the joint included in the sub-liquid-pipe connection 2322 is configured by screw connection. The diameter of the joint can be changed by replacing a type of the joint with a common screw part, as illustrated in FIG. 9B.

Figure 10:
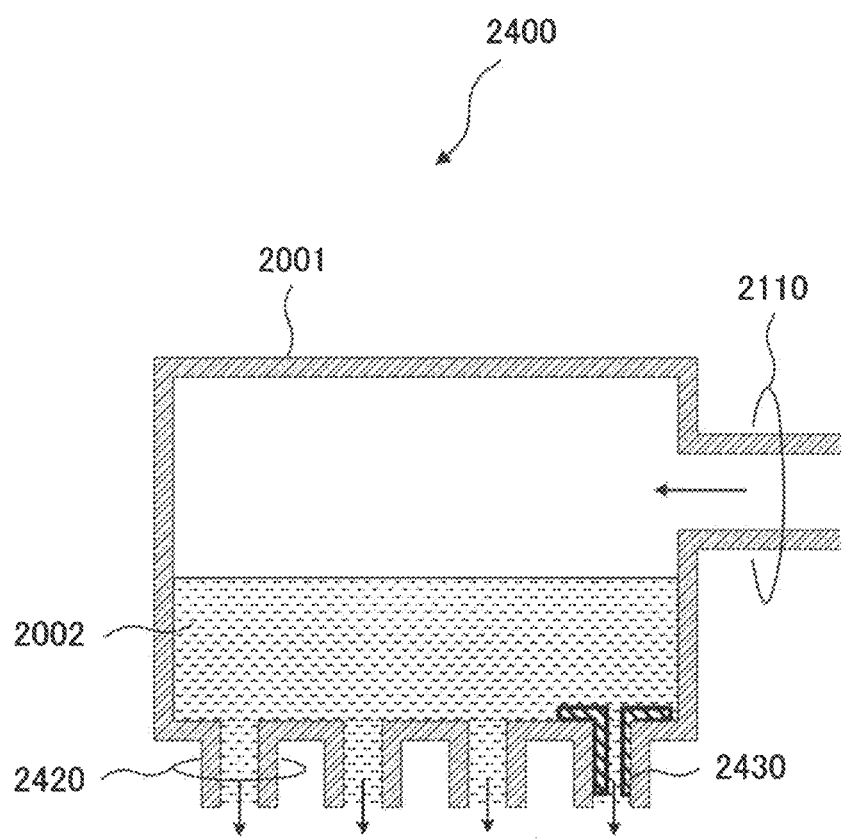
FIG. 10 is a cross-sectional view illustrating another configuration of the refrigerant liquid reservoir included in the refrigerant liquid transport structure in accordance with the fourth example embodiment of the present invention.

The configuration of the sub-liquid-pipe connection with the internal diameter of the above-mentioned joint differing from each other can also be achieved by using a tubular attachment 2430, as illustrated in FIG. 10. More specifically, a sub-liquid-pipe connection 2420 included in the refrigerant liquid reservoir 2400 can be configured to include a joint and a tubular attachment 2430 that is attached inside the joint. The container 2001 can be configured to include at least two pieces of the sub-liquid-pipe connections 2420 in which the internal diameters of the joints are equal to each other, and the internal diameters of the attachments 2430 differ from each other.

In this case, a plurality of joints with the internal diameters equal to each other are formed in advance, and the internal diameter can be adjusted by using the attachment 2430 depending on the amount of heat generation in the heat receiving unit. This makes it possible to reduce the manufacturing cost. Specifically, the attachment 2430 can be a cap-shaped adapter, for example. Although FIG. 10 illustrates the configuration in which the attachment 2430 is attached from the inside of the container 2001, the attachment 2430 may be attached from the outside of the container 2001.

By employing the above-mentioned configuration, according to the phase-change cooling device including the refrigerant liquid reservoir by the present example embodiment, it is possible to cool a plurality of heat sources efficiently employing a natural-circulation type phase-change cooling system without the increase in device cost and maintenance cost.

A Fifth Example Embodiment

Figure 11:
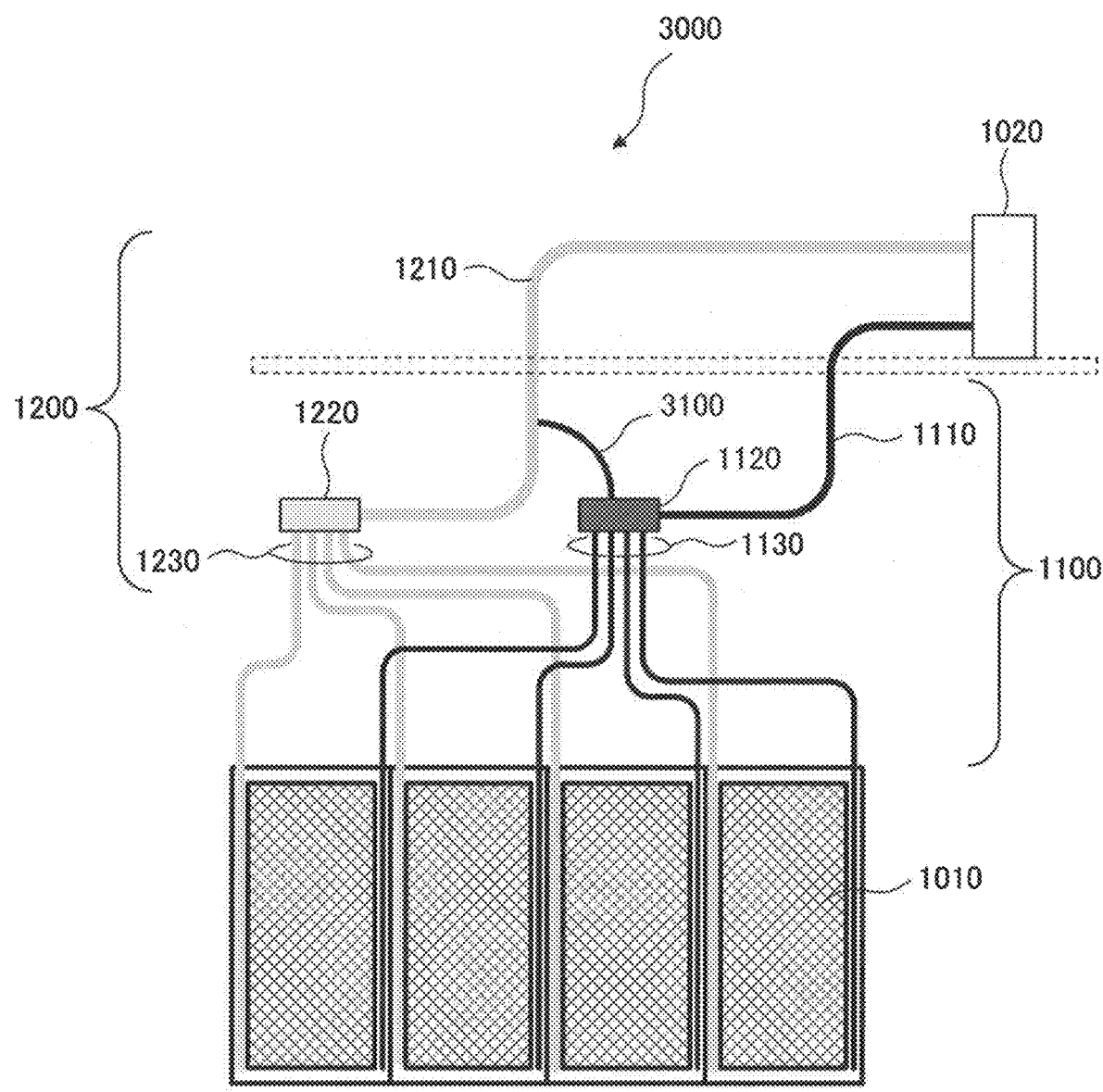
FIG. 11 is a schematic view illustrating a configuration of a phase-change cooling device in accordance with a fifth example embodiment of the present invention.

Next, a fifth example embodiment of the present invention will be described. FIG. 11 is a schematic view illustrating the configuration of a phase-change cooling device 3000 in accordance with the fifth example embodiment of the present invention. The phase-change cooling device 3000 according to the present example embodiment includes a plurality of heat receiving units 1010, a condensing unit 1020, a refrigerant liquid transport structure 1100, and a refrigerant vapor transport structure 1200.

The plurality of heat receiving units 1010 respectively hold refrigerant that receives heat from a plurality of heat sources. The condensing unit 1020 generates refrigerant liquid by condensing and liquefying refrigerant vapor of the refrigerant evaporated in the heat receiving units 1010. The refrigerant liquid transport structure 1100 connects the heat receiving units 1010 to the condensing unit 1020 and transports the refrigerant liquid. The refrigerant vapor transport structure 1200 connects the heat receiving units 1010 to the condensing unit 1020 and transports the refrigerant vapor.

The refrigerant liquid transport structure 1100 includes a main-liquid-pipe 1110 connected to the condensing unit 1020, a refrigerant liquid reservoir 1120 connected to the main-liquid-pipe 1110 and configured to store refrigerant liquid, and a plurality of sub-liquid-pipes 1130 respectively connecting the refrigerant liquid reservoir 1120 to the plurality of heat receiving units 1010.

The above-described configuration is the same as the configuration of the phase-change cooling device 1000 according to the first example embodiment. The phase-change cooling device 3000 according to the present example embodiment further includes a branch pipe 3100 connecting the refrigerant liquid reservoir 1120 to the refrigerant vapor transport structure 1200.

In the phase-change cooling device employing a natural-circulation type phase-change cooling system, refrigerant bubbles generated by receiving heat in the heat receiving unit 1010 move upwards involving the liquid-phase refrigerant in the surrounding area; consequently, there can be liquid-phase refrigerant liquid also in the refrigerant vapor transport structure 1200. The refrigerant liquid in the refrigerant vapor transport structure 1200 causes an increase in fluid resistance to the refrigerant vapor.

In the phase-change cooling device 3000 according to the present example embodiment, however, the branch pipe 3100 enables the refrigerant liquid in the refrigerant vapor transport structure 1200 to return to the refrigerant liquid transport structure 1100 that is located on the liquid-phase side. This makes it possible to decrease the fluid resistance to the refrigerant vapor due to the presence of the refrigerant liquid in the refrigerant vapor transport structure 1200, which enables the thermal transport efficiency to improve.

Thus, according to the phase-change cooling device 3000 of the present example embodiment, it is possible to cool a plurality of heat sources efficiently employing a natural-circulation type phase-change cooling system without the increase in device cost and maintenance cost.

Although the configuration of the refrigerant vapor transport structure 1200 is not particularly limited, as illustrated in FIG. 11, for example, it can be configured to include a main-vapor-pipe 1210, a vapor joining portion 1220, and a plurality of sub-vapor-pipes 1230. The main-vapor-pipe 1210 is connected to the condensing unit 1020. The vapor joining portion 1220 is connected to the main-vapor-pipe 1210, and the refrigerant vapor meets in the vapor joining portion 1220. The plurality of sub-vapor-pipes 1230 connect the vapor joining portion 1220 to the plurality of heat receiving units 1010, respectively. In this case, the branch pipe 3100 can be configured to connect the main-vapor-pipe 1210 to the refrigerant liquid reservoir 1120, as illustrated in FIG. 11, for example.

A Sixth Example Embodiment

Figure 12:
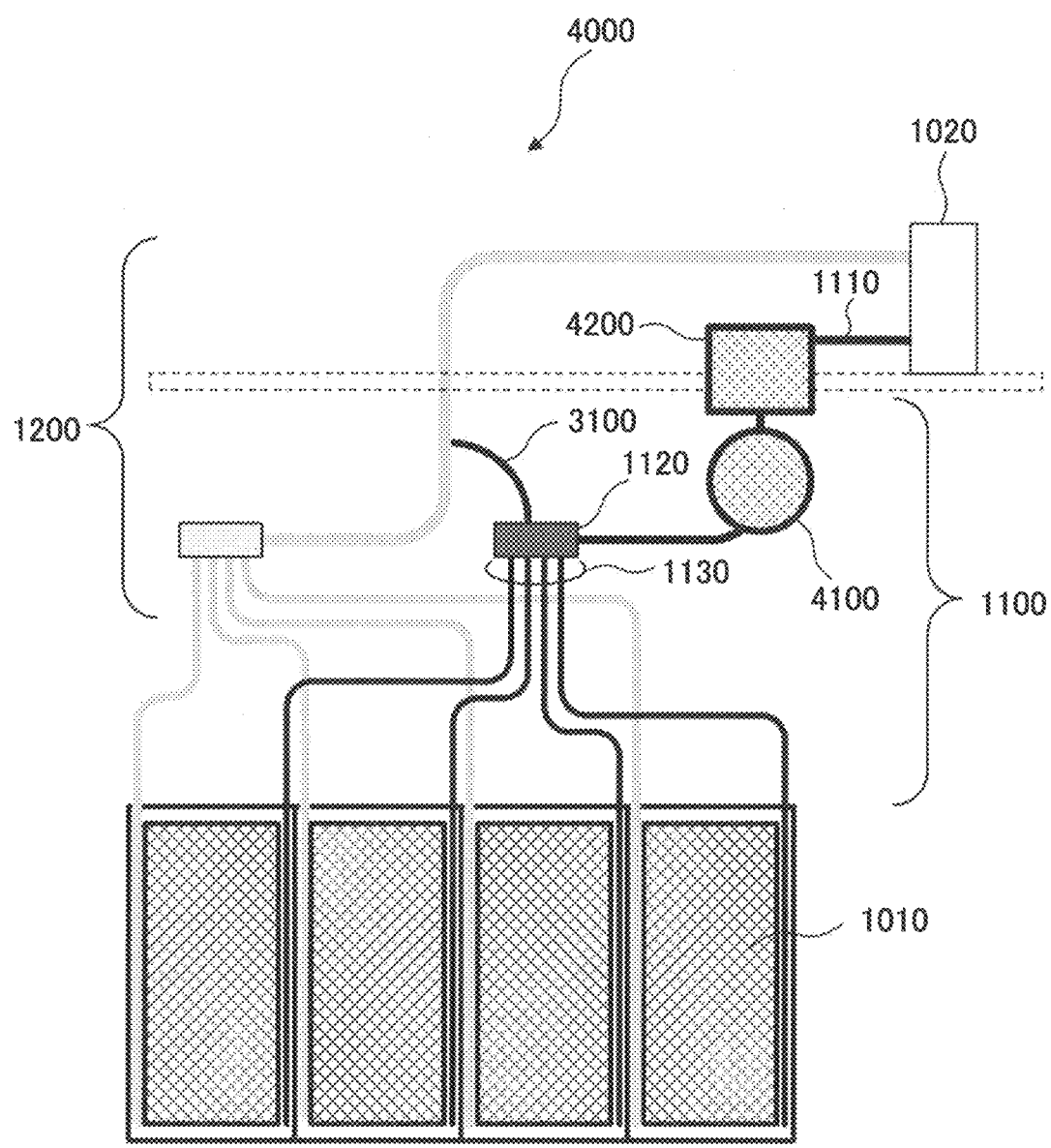
FIG. 12 is a schematic view illustrating a configuration of a phase-change cooling device in accordance with a sixth example embodiment of the present invention.

Next, a sixth example embodiment of the present invention will be described. FIG. 12 is a schematic view illustrating the configuration of the phase-change cooling device 4000 according to the sixth example embodiment of the present invention. The phase-change cooling device 4000 according to the present example embodiment includes a plurality of heat receiving units 1010, a condensing unit 1020, a refrigerant liquid transport structure 1100, and a refrigerant vapor transport structure 1200.

The plurality of heat receiving units 1010 respectively hold refrigerant that receives heat from a plurality of heat sources. The condensing unit 1020 generates refrigerant liquid by condensing and liquefying refrigerant vapor of the refrigerant evaporated in the heat receiving units 1010. The refrigerant liquid transport structure 1100 connects the heat receiving units 1010 to the condensing unit 1020 and transports the refrigerant liquid. The refrigerant vapor transport structure 1200 connects the heat receiving units 1010 to the condensing unit 1020 and transports the refrigerant vapor.

The refrigerant liquid transport structure 1100 includes a main-liquid-pipe 1110 connected to the condensing unit 1020, a refrigerant liquid reservoir 1120 connected to the main-liquid-pipe 1110 and configured to store refrigerant liquid, and a plurality of sub-liquid-pipes 1130 respectively connecting the refrigerant liquid reservoir 1120 to the plurality of heat receiving units 1010.

The above-described configuration is the same as the configuration of the phase-change cooling device 1000 according to the first example embodiment. The phase-change cooling device 4000 according to the present example embodiment further includes a driving pump 4100 and an auxiliary tank 4200 in the flow path of the refrigerant liquid provided by the main-liquid-pipe 1110. That is to say, the auxiliary tank 4200 and the driving pump 4100 are connected to the main-liquid-pipe 1110, and the refrigerant liquid reservoir 1120 is connected to the output side of the driving pump 4100. This configuration makes it possible to distribute the refrigerant liquid to each heat receiving unit 1010 more efficiently.

In this case, using the driving pump 4100 increases the power consumption for that. However, the increase in refrigerant transportation capacity by the driving pump 4100 improves the cooling performance of the phase-change cooling device 4000; consequently, it is possible to save the overall energy of the system using the phase-change cooling device 4000.

If the refrigerant liquid is transported using the driving pump 4100, the refrigerant liquid is pushed out of the heat receiving units 1010 before the refrigerant liquid evaporates. As a result, there is the refrigerant liquid pushed out in the refrigerant vapor transport structure 1200. However, as is the case with the phase-change cooling device 3000 according to the fifth example embodiment, the configuration including a branch pipe 3100 connecting the refrigerant vapor transport structure 1200 to the refrigerant liquid reservoir 1120 enables the refrigerant liquid in the refrigerant vapor transport structure 1200 to return to the refrigerant liquid reservoir 1120. This makes it possible to prevent the increase in the fluid resistance to the refrigerant vapor due to the refrigerant liquid pushed out into the refrigerant vapor transport structure 1200.

The present invention has been described using the above-mentioned example embodiments as exemplary examples. The present invention, however, is not limited to the above-mentioned example embodiments. That is to say, various aspects that can be understood by those skilled in the art can be applied to the present invention within the scope of the present invention.

This application is based upon and claims the benefit of priority from Japanese patent application No. 2014-172115, filed on Aug. 27, 2014, the disclosure of which is incorporated herein in its entirety by reference.

REFERENCE SIGNS LIST 1000, 3000, 4000 phase-change cooling device
1010, 1011, 1012 heat receiving unit
1020 condensing unit
1100, 1101 refrigerant liquid transport structure
1110 main-liquid-pipe
1120, 2100, 2101, 2102, 2200, 2300, 2400 refrigerant liquid reservoir
1130 sub-liquid-pipe
1200 refrigerant vapor transport structure
1210 main-vapor-pipe
1220 vapor joining portion
1230 sub-vapor-pipe
2001 container
2002 refrigerant liquid
2110 main-liquid-pipe connection
2120, 2220, 2320, 2321, 2322, 2420 sub-liquid-pipe connection
2430 attachment
3100 branch pipe
4100 driving pump
4200 auxiliary tank

The invention claimed is:

1. A phase-change cooling device, comprising:
a plurality of evaporators configured to hold respectively refrigerant receiving heat from a plurality of heat sources;
a condenser configured to generate refrigerant liquid by condensing and liquefying refrigerant vapor of the refrigerant evaporated in the plurality of evaporators;
a refrigerant vapor transport structure connecting the plurality of evaporators to the condenser and configured to transport the refrigerant vapor; and
a refrigerant liquid transport structure connecting the plurality of evaporators to the condenser and configured to transport the refrigerant liquid,
wherein the refrigerant liquid transport structure includes:
a main-liquid-pipe connected to the condenser,
a refrigerant liquid reservoir connected to the main-liquid-pipe and configured to store the refrigerant liquid, and
a plurality of sub-liquid-pipes respectively connecting the refrigerant liquid reservoir to the plurality of evaporators,
wherein the refrigerant liquid reservoir includes a container,
wherein the container includes a plurality of sub-liquid-pipe connections located on a bottom surface of a lower side and connected to the plurality of sub-liquid-pipes,
wherein each of the plurality of sub-liquid-pipes connects each of the plurality of evaporators and each of the plurality of sub-liquid-pipe connections,
wherein the container includes a main-liquid-pipe connection connected to the main-liquid-pipe and located on one of an upper surface and a side surface,
wherein each of the plurality of sub-liquid-pipe connections includes a joint, and
wherein the container includes at least two pieces of the plurality of sub-liquid-pipe connections including the joints with internal diameters, each internal diameter of the joints being different from each other.

2. The phase-change cooling device according to claim 1, wherein the refrigerant liquid reservoir is located below the condenser and above the plurality of evaporators.

3. The phase-change cooling device according to claim 1, wherein the plurality of sub-liquid-pipe connections are disposed near a position where a height of the bottom surface is smallest.

4. The phase-change cooling device according to claim 1, wherein the plurality of sub-liquid-pipe connections are disposed near a center of the bottom surface.

5. The phase-change cooling device according to claim 1, wherein a sum of cross-sectional areas of the plurality of sub-liquid-pipe connections through which the refrigerant liquid flows is equal to a cross-sectional area of the main-liquid-pipe connection through which the refrigerant liquid flows.

6. The phase-change cooling device according to claim 1, further comprising a branch pipe connecting the refrigerant liquid reservoir to the refrigerant vapor transport structure.

7. The phase-change cooling device according to claim 1, further comprising a driving pump and an auxiliary tank in a flow path of the refrigerant liquid provided by the main-liquid-pipe.

8. The phase-change cooling device according to claim 1, wherein the refrigerant liquid transport structure includes a plurality of the refrigerant liquid reservoirs, and
a plurality of different evaporators are respectively connected to the plurality of the refrigerant liquid reservoirs.

9. The phase-change cooling device according to claim 1, wherein the plurality of evaporators include a plurality of evaporating units, each of which is thermally connected to a heat source and stores the refrigerant, and
the plurality of evaporating units are disposed in a vertical direction.

10. A phase-change cooling device, comprising:
a plurality of evaporators configured to hold respectively refrigerant receiving heat from a plurality of heat sources;

a condenser configured to generate refrigerant liquid by condensing and liquefying refrigerant vapor of the refrigerant evaporated in the plurality of evaporators;
a refrigerant vapor transport structure connecting the plurality of evaporators to the condenser and configured to transport the refrigerant vapor; and
a refrigerant liquid transport structure connecting the plurality of evaporators to the condenser and configured to transport the refrigerant liquid,
wherein the refrigerant liquid transport structure includes:
a main-liquid-pipe connected to the condenser,
a refrigerant liquid reservoir connected to the main-liquid-pipe and configured to store the refrigerant liquid, and
a plurality of sub-liquid-pipes respectively connecting the refrigerant liquid reservoir to the plurality of evaporators,
wherein the refrigerant liquid reservoir includes a container,
wherein the container includes a plurality of sub-liquid-pipe connections located on a bottom surface of a lower side and connected to the plurality of sub-liquid-pipes,
wherein each of the plurality of sub-liquid-pipes connects each of the plurality of evaporators and each of the plurality of sub-liquid-pipe connections,
wherein the container includes a main-liquid-pipe connection connected to the main-liquid-pipe and located on one of an upper surface and a side surface,
wherein the sub-liquid-pipe connection includes a joint and an attachment with a tubular shape attached inside the joint, and
wherein the container includes at least two pieces of the sub-liquid-pipe connections in which internal diameters of the joints are equal to each other, and internal diameters of the attachments differ from each other.

11. The phase-change cooling device according to claim 10,
wherein the refrigerant liquid reservoir is located below the condenser and above the plurality of evaporators.

12. The phase-change cooling device according to claim 10,
wherein the plurality of sub-liquid-pipe connections are disposed near a position where a height of the bottom surface is smallest.

13. The phase-change cooling device according to claim 10,
wherein the plurality of sub-liquid-pipe connections are disposed near a center of the bottom surface.

14. The phase-change cooling device according to claim 10,
wherein a sum of cross-sectional areas of the plurality of sub-liquid-pipe connections through which the refrigerant liquid flows is equal to a cross-sectional area of the main-liquid-pipe connection through which the refrigerant liquid flows.

15. The phase-change cooling device according to claim 10, further comprising a branch pipe connecting the refrigerant liquid reservoir to the refrigerant vapor transport structure.

16. The phase-change cooling device according to claim 10, further comprising a driving pump and an auxiliary tank in a flow path of the refrigerant liquid provided by the main-liquid-pipe.

17. The phase-change cooling device according to claim 10,
wherein the refrigerant liquid transport structure includes a plurality of the refrigerant liquid reservoirs, and
a plurality of different evaporators are respectively connected to the plurality of the refrigerant liquid reservoirs.

18. The phase-change cooling device according to claim 10,
wherein the evaporators include a plurality of evaporating units, each of which is thermally connected to a heat source and stores the refrigerant, and
the plurality of evaporating units are disposed in a vertical direction.

* * * * *